United States Patent
Oh et al.

(10) Patent No.: US 7,883,969 B2
(45) Date of Patent: Feb. 8, 2011

(54) METAL OXIDE SEMICONDUCTOR FIELD EFFECT TRANSISTORS (MOSFETS) INCLUDING RECESSED CHANNEL REGIONS AND METHODS OF FABRICATING THE SAME

(75) Inventors: Chang-Woo Oh, Gyeonggi-do (KR); Dong-Gun Park, Gyeonggi-do (KR); Sung-Young Lee, Gyeonggi-do (KR); Chang-Sub Lee, Gyeonggi-do (KR); Jeong-Dong Choe, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 12/106,683

(22) Filed: Apr. 21, 2008

(65) Prior Publication Data

US 2008/0224206 A1    Sep. 18, 2008

Related U.S. Application Data

(62) Division of application No. 10/795,653, filed on Mar. 8, 2004, now abandoned.

(30) Foreign Application Priority Data

Apr. 23, 2003   (KR) ................... 2003-25824

(51) Int. Cl.
*H01L 21/336* (2006.01)
(52) U.S. Cl. ............... 438/270; 257/E21.428
(58) Field of Classification Search ........ 438/259, 438/270; 257/E21.41, E21.426, 330
See application file for complete search history.

(56) References Cited

U.S. PATENT DOCUMENTS

| 5,552,329 | A | 9/1996 | Kim et al. |
|---|---|---|---|
| 5,891,763 | A | 4/1999 | Wanlass |
| 5,953,604 | A | 9/1999 | Lien |
| 6,011,290 | A | 1/2000 | Gardner et al. |
| 6,180,465 | B1 | 1/2001 | Gardner et al. |
| 6,372,563 | B1 | 4/2002 | Krivokapic et al. |
| 6,579,765 | B1 | 6/2003 | Ellis |
| 6,864,547 | B2 | 3/2005 | Michejda et al. |
| 2002/0132432 | A1 | 9/2002 | Blanchard |
| 2003/0008452 | A1* | 1/2003 | Takagi ............ 438/218 |
| 2003/0082872 | A1 | 5/2003 | Leobandung |
| 2004/0155296 | A1 | 8/2004 | Kim et al. |
| 2004/0169221 | A1 | 9/2004 | Ko et al. |

FOREIGN PATENT DOCUMENTS

| JP | 64-66966 | 3/1989 |
|---|---|---|
| JP | 01-268061 | 10/1989 |
| JP | 02-002172 | 1/1990 |
| JP | 03-133142 | 6/1991 |

(Continued)

OTHER PUBLICATIONS

NN8901114, "Self-Aligned Quasi-Semiconductor-On-Insulator CMOS Structure," IBM TDB, vol. 31, Jan. 1989.

*Primary Examiner*—Matthew C Landau
*Assistant Examiner*—Sonya D McCall-Shepard
(74) *Attorney, Agent, or Firm*—Myers Bigel Sibley & Sajovec

(57) ABSTRACT

Unit cells of metal oxide semiconductor (MOS) transistors are provided having an integrated circuit substrate and a MOS transistor on the integrated circuit substrate. The MOS transistor includes a source region, a drain region and a gate. The gate is between the source region and the drain region. A channel region is provided between the source and drain regions. The channel region has a recessed region that is lower than bottom surfaces of the source and drain regions. Related methods of fabricating transistors are also provided.

18 Claims, 20 Drawing Sheets

FOREIGN PATENT DOCUMENTS

| | | |
|---|---|---|
| JP | 03-231471 | 10/1991 |
| JP | 07-226513 | 8/1995 |
| JP | 2000-082813 | 3/2000 |
| JP | 2000-277731 | 10/2000 |
| JP | 2000-332242 | 11/2000 |
| JP | 2002-208696 | 7/2002 |
| KR | 10-0304713 | 7/2001 |
| KR | 1020020071574 A | 9/2002 |

* cited by examiner

METAL OXIDE SEMICONDUCTOR FIELD EFFECT TRANSISTORS (MOSFETS) INCLUDING RECESSED CHANNEL REGIONS AND METHODS OF FABRICATING THE SAME

RELATED APPLICATIONS

This application is a divisional application of and claims priority to U.S. patent application Ser. No. 10/795,653, filed Mar. 8, 2004, now abandoned which claims priority from Korean Patent Application No. 2003-25824 filed on Apr. 23, 2003, the disclosures of which are hereby incorporated herein by reference as if set forth in their entirety.

FIELD OF THE INVENTION

The present invention relates to integrated circuit devices and methods of fabricating the same and, more particularly, to integrated circuit transistors and methods of fabricating the same.

BACKGROUND OF THE INVENTION

As the size of conventional transistors is decreased, the characteristics of the device may be adversely affected. For example, transistors may experience a short channel effect. Referring now to FIG. 1, a cross-section illustrating conventional transistors will be discussed. As illustrated, conventional transistors may include a gate insulation layer 14 on an integrated circuit substrate 10. A gate electrode 16 may be provided on the gate insulation layer 14. Source and drain regions 12 may be formed in the integrated circuit substrate 10 by implanting impurities in the integrated circuit substrate 10 adjacent both sides of the gate electrode 16. Regions between the source and drain regions 12 define channel regions of the transistor.

In conventional transistors illustrated in FIG. 1, when a length of the channel is decreased, the influence of the source and drain regions on the channel region may increase. Accordingly, a short channel effect, for example, a change of a threshold voltage, an increase in a leakage current and/or a punch-through between the source and drain regions may occur. The reduction in size of conventional transistors may be limited by the occurrence of the short channel effect. Therefore, highly integrated devices may be difficult to fabricate.

Conventional silicon-on-insulator (SOI) transistors may reduce the likelihood of the occurrence of the short channel effect. Referring now to FIG. 2 a cross section of conventional SOI transistors will be discussed. As illustrated, a gate insulation layer 26 is provided on a SOI layer 25. The SOI layer is provided on a buried insulation layer 22 and the buried insulation layer 22 is provided on the integrated circuit substrate 10. A gate electrode 28 is formed on the gate insulation layer 26. Source and drain regions 24 are provided in the SOI layer by implanting impurities in the SOI layer 25 adjacent both sides of the gate electrode 28. Regions between the source and drain regions 24 define channel regions of the transistor.

As illustrated in FIG. 2, a source and/or drain junction of the SOI transistor contacts the buried insulation layer 22. Accordingly, a depletion layer of the source and/or drain junction may be suppressed so that a short channel effect and/or a leakage current may possibly be reduced. However, a floating body effect may occur in SOI transistors because the SOI layer 25 is isolated by the buried insulation layer 22 and an isolation layer. Thus, dispersion of heat generated from operating integrated circuit devices may be difficult and manufacturing costs may be increased. Accordingly, improved integrated circuit devices may be desired.

SUMMARY OF THE INVENTION

Embodiments of the present invention provide metal oxide semiconductor (MOS) transistors and methods of fabricating the same. A unit cell of a MOS transistor is provided having an integrated circuit substrate and a MOS transistor on the integrated circuit substrate. The MOS transistor includes a source region, a drain region and a gate. The gate is between the source region and the drain region. A channel region is provided between the source and drain regions. The channel region has a recessed region that is lower than bottom surfaces of the source and drain regions.

In some embodiments of the present invention, first and second insulation patterns may be provided on the integrated circuit substrate. The first and second insulation patterns may be provided between the source region and drain region, respectively, and the integrated circuit substrate. The first and second insulation patterns may further contact at least a portion of the bottom surface of the source region and the bottom surface of the drain region, respectively.

In further embodiments of the present invention, the gate may further include a gate insulation layer on the channel region and a gate pattern on the gate insulation layer. The gate pattern may have sidewalls adjacent to the source and drain regions. The first and second insulation patterns may have sidewalls that are self-aligned to the sidewalls of the gate pattern. In certain embodiments of the present invention, the gate pattern may be provided in a gate opening on the integrated circuit substrate. The gate pattern may include first and second inner spacers on sidewalls of the gate opening and a conductive pattern on the first and second inner spacers and the gate insulation layer.

In still further embodiments of the present invention, an isolation layer may be provided on the integrated circuit substrate. The isolation layer may define an active region of the integrated circuit substrate. The insulation pattern may be electrically coupled to the isolation layer. In certain embodiments of the present invention, a bottom surface of the isolation layer may be lower than a bottom surface of the insulation pattern.

While the present invention is described above primarily with reference integrated circuit devices, methods of forming integrated circuit devices are also provided herein.

BRIEF DESCRIPTION OF THE DRAWINGS

FIGS. 4A through 10A are plan views illustrating processing steps in the fabrication of MOSFETs according to further embodiments of the present invention.

FIGS. 4B through 10B are cross sections taken along the line A-A' of FIGS. 4A through 9A illustrating processing steps in the fabrication of MOSFETs according to further embodiments of the present invention.

FIGS. 13A through 16A are plan views illustrating processing steps in the fabrication of MOSFETs according to some embodiments of the present invention.

FIGS. 13B through 16B are cross sections taken along the line C-C' of FIGS. 12A through 15A illustrating processing steps in the fabrication of MOSFETs according to some embodiments of the present invention.

FIGS. 17A through 21A are plan views illustrating processing steps in the fabrication of MOSFETs according to further embodiments of the present invention.

FIGS. 17B through 21B are cross sections taken along the lines D-D' in FIGS. 17A through 21B illustrating processing steps in the fabrication of MOSFETs according to further embodiments of the present invention.

DETAILED DESCRIPTION OF EMBODIMENTS OF THE INVENTION

Figure 1:
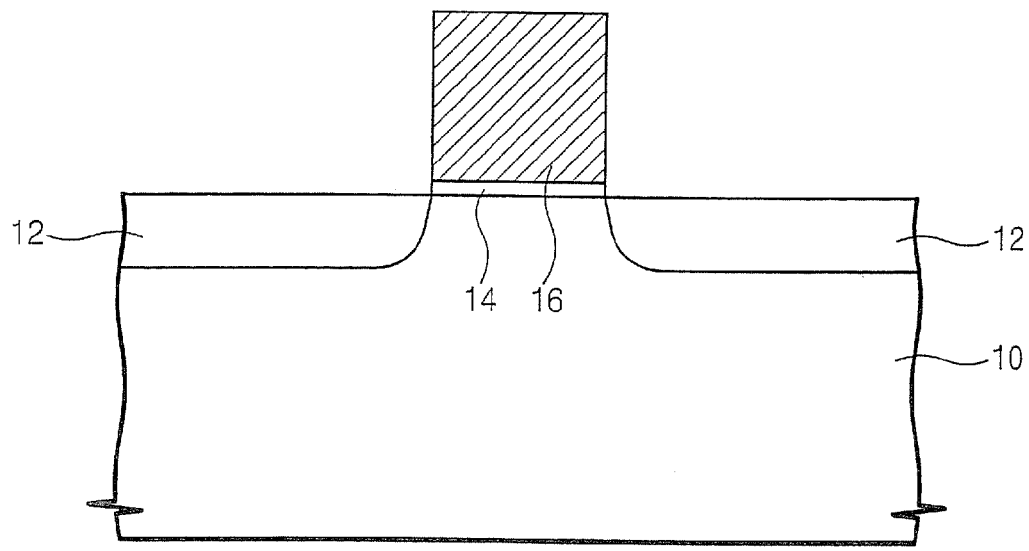
FIG. 1 is a cross section illustrating conventional metal oxide semiconductor field effect transistors (MOSFETs).
Figure 2:
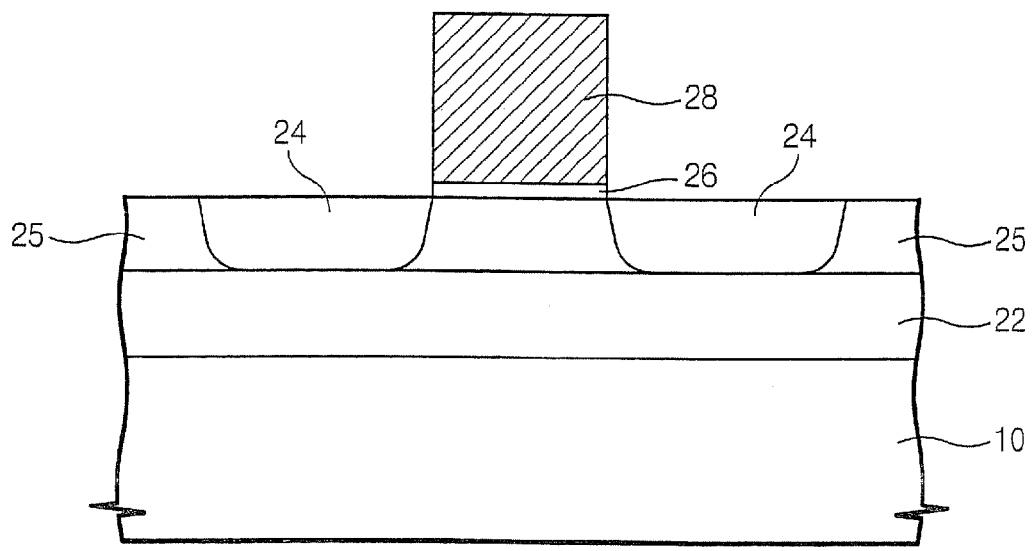
FIG. 2 is a cross section illustrating conventional silicon-on-insulator (SOI) MOSFETs.

The present invention now will be described more filly hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. It will be understood that when part of an element is referred to as "outer," it is closer to the outside of the integrated circuit than other parts of the element. Like numbers refer to like elements throughout.

Furthermore, relative terms, such as beneath, may be used herein to describe an element's relationship to another as illustrated in the Figures. It will be understood that these terms are intended to encompass different orientations of the elements in addition to the orientation depicted in the Figures. For example, if a Figure is inverted, the elements described as "beneath" other elements would be oriented "above" these other elements. The relative terms are, therefore, intended to encompass all possible arrangements of the elements and not just the ones shown in the Figures.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 3 through 21B. Embodiments of the present invention provide transistors having a low recessed channel region relative to bottom surfaces of the source and drain regions. Thus, a channel length of transistors according to embodiments of the present invention may be longer relative to a gate line width, while still having a relatively short gate line width. Thus, the likelihood that transistors according to embodiments of the present invention may experience a short channel effect and/or punch-through between the source and drain regions may be reduced. Furthermore, transistors according to embodiments of the present invention may provide source and drain regions having bottom surfaces that contact at least a portion of an insulation pattern and a channel region between the source and drain regions may be connected to the integrated circuit substrate. Accordingly, transistors according to embodiments of the present invention may provide a reduced likelihood of the occurrence of the short channel effect and a floating body effect and may disperse heat throughout the device during operation of the transistor. In still further embodiments of the present invention, transistors according to embodiments of the present invention may have a gate pattern having sidewalls aligned with parallel fins that include the source and drain regions, thus, the possibility of misalignment of the gate pattern may be reduced. Accordingly, transistors according to embodiments of the present invention may provide improved device characteristics as discussed further below.

Figure 3:
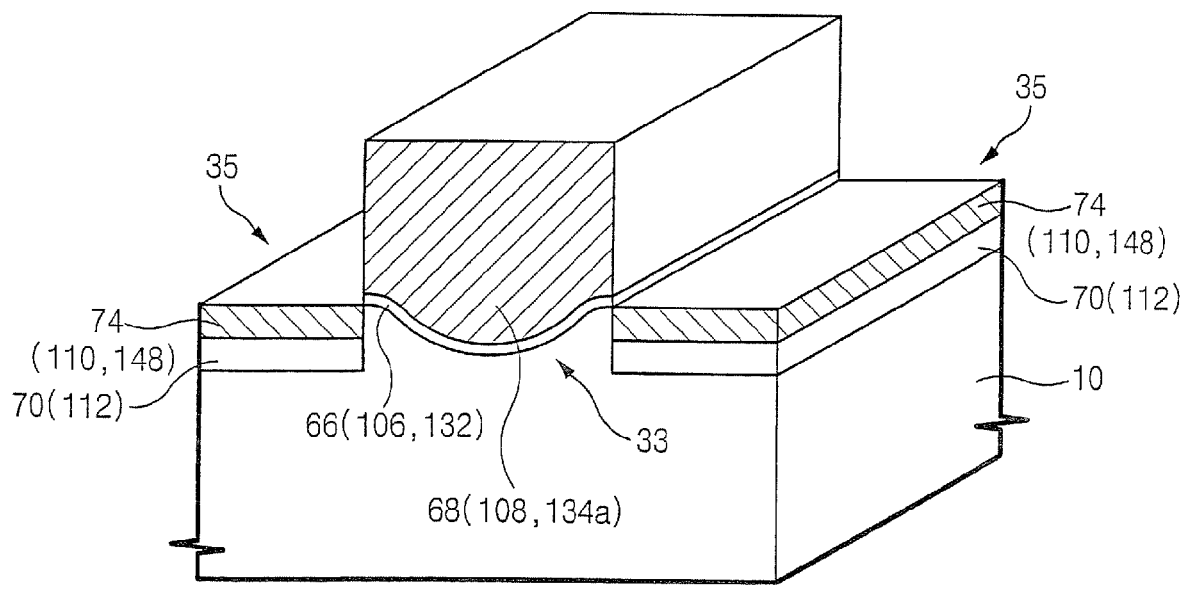
FIG. 3 is a perspective view illustrating MOSFETs according to some embodiments of the present invention.

Referring now to FIG. 3, a perspective view of transistors, according to some embodiments of the present invention, will be discussed. As illustrated in FIG. 3, the transistor comprises a vertical portion 33 and parallel fins 35. The vertical portion 33 is provided on an integrated circuit substrate 10. The parallel fins 35 extend from a bottom portion of the vertical portion 33 as illustrated in FIG. 3. Source and drain regions are provided in each of the parallel fins 35. Regions between the source and drain regions define channel regions of the transistor. As further illustrated in FIG. 3, the channel region of the transistor is formed on a recess region and a bottom of the recess region is lower than bottoms of the source and drain regions. Gate insulation layers 66, 106 and 132 are provided on the channel region. Gate patterns 68, 108 and 134a are provided on the gate insulation layers 66, 106 and 132. The Parallel fins 35 are separated from the integrated circuit substrate in a predetermined space. Insulation patterns 70 and 112 are provided between the source and drain regions, i.e., between the parallel fins 35 and the integrated circuit substrate 10. Sidewalls of the gate patterns 68, 108 and 134a are vertically aligned to sidewalls of vertical portion 33. The source and drain regions 74, 110 and 148 and insulation patterns 70 and 112 are symmetrically arranged around the gate electrode.

As illustrated in FIG. 3, the bottom surfaces of the source and drain regions 74, 110 and 148 are higher than a bottom surface of the channel region. Thus, although the gate pattern has minimum line width, the channel length of the transistor may be relatively longer than a line width of a gate. The likelihood of the occurrence of the short channel effect may be reduced because the bottom surfaces of the source and drain regions 74, 110 and 148 contact the insulation patterns 70 and 112, for example, oxide patterns. In addition, a floating body effect may be controlled and heat may be adequately dispersed.

In certain embodiments of the present invention, a suicide layer may be formed on a surface of the source and drain regions 74, 110 and 148 and a surface of the gate pattern 68, 108 and 134a. In this embodiment, contact of the silicide layer and the source and drain regions 74, 110 and 148 and the gate pattern 68, 108 and 134a can be controlled by providing a spacer on sidewalls of the gate pattern 68, 108 and 134a.

Figure 4A:
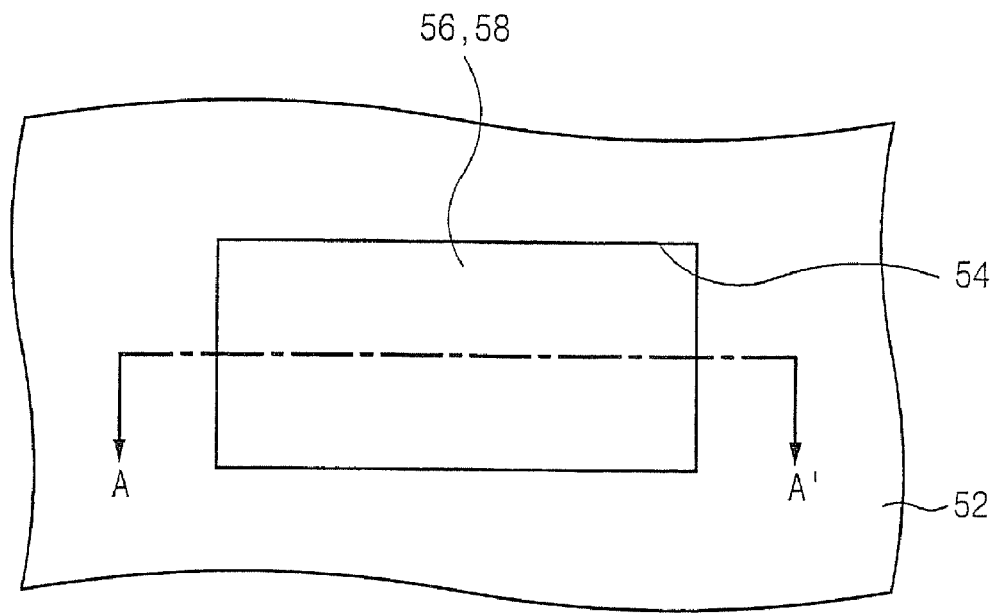
Figure 4B:
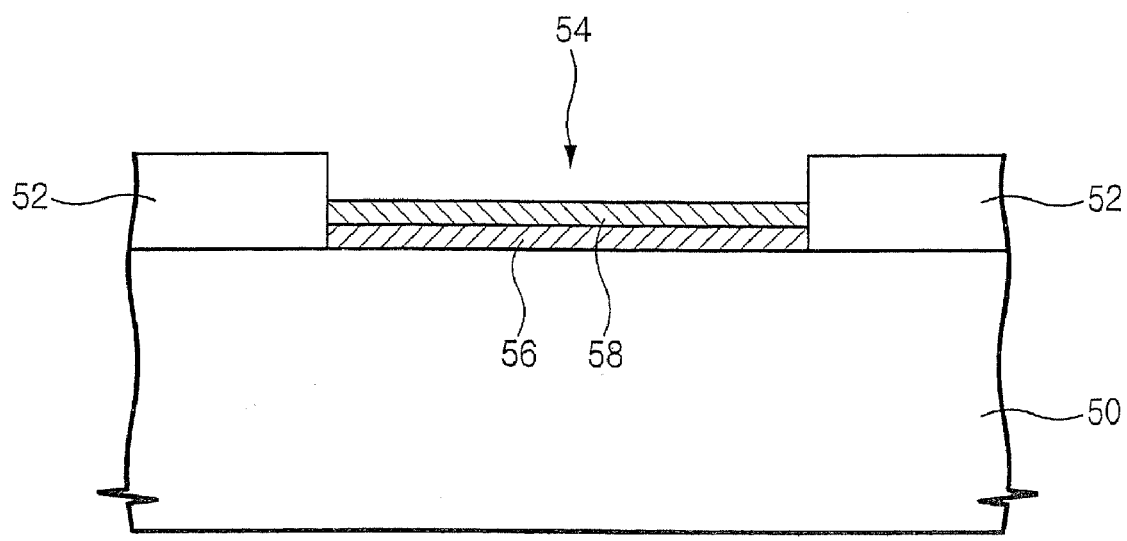

FIGS. 4A through 9A are plan views illustrating processing steps in the fabrication of transistors according to some embodiments of the present invention. FIGS. 4B through 9B are cross sections taken along the line A-A' in FIGS. 4A through 9A. Referring to FIGS. 4A and 4B, a sacrificial pattern 52 having an opening 54 is formed on the integrated circuit substrate 50. An active region is defined by the opening 54. A first epitaxial layer 56 and a second epitaxial layer 58 are sequentially formed on the integrated circuit substrate 50 exposed in the opening 54. The first epitaxial layer 56 and the second epitaxial layer 58 may have a lattice constant similar to the integrated circuit substrate 50. The first epitaxial layer 56 and the second epitaxial layer 58 have etching selectivities with respect to each other. In other words, the first epitaxial layer 56 may be, for example, a silicon germanium epitaxial layer, and the second epitaxial layer 58 may be, for example, a silicon epitaxial layer.

Figure 5A:
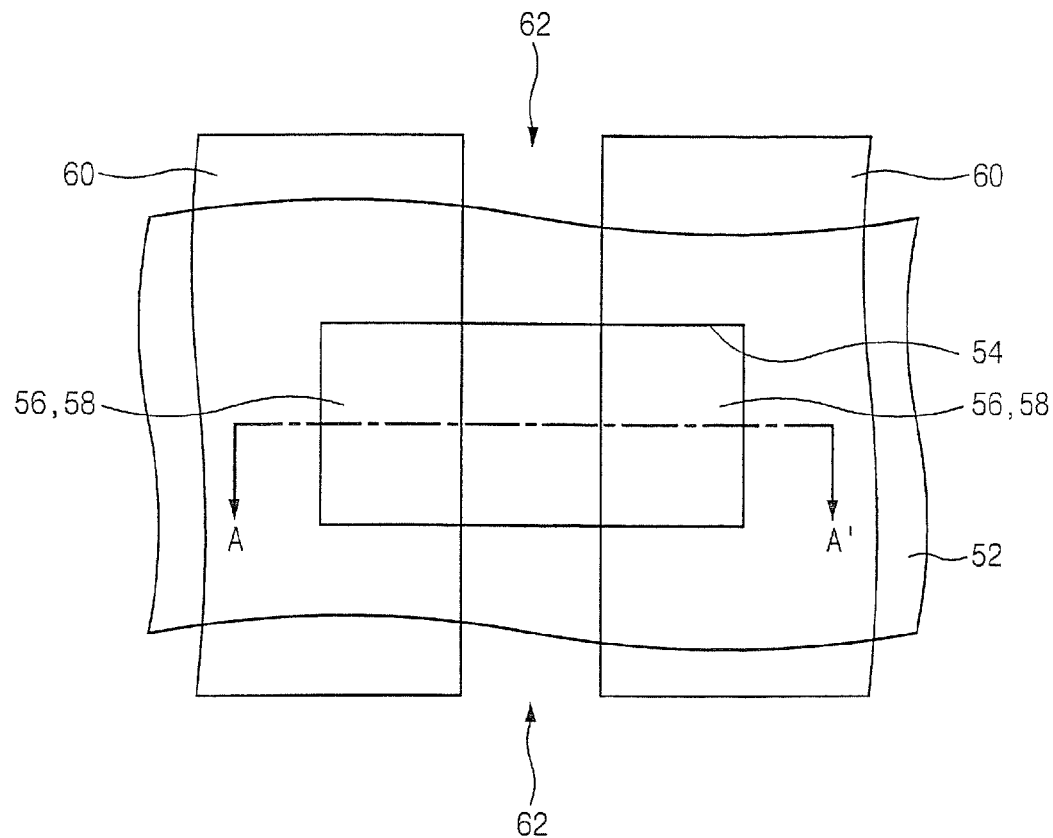
Figure 5B:
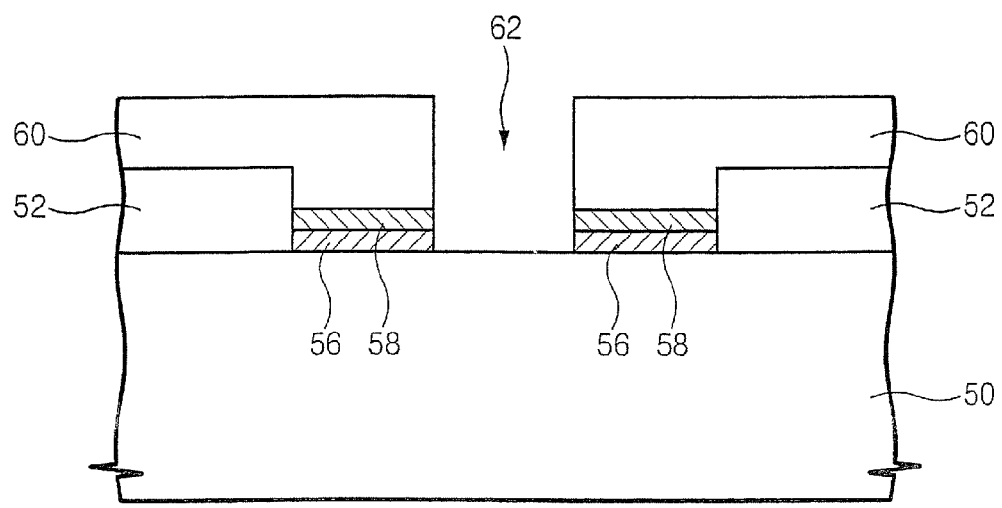

Referring now to FIGS. 5A and 5B, a mask layer 60 is formed on a surface of the integrated circuit substrate 50. The mask layer 60 is patterned to form a gate opening 62 on the active region and the sacrificial layer 52. The second epitaxial layer 58 and the first epitaxial layer 56 are etched in the gate opening 62 to expose the integrated circuit substrate 50. As illustrated in FIG. 5B, the integrated circuit substrate 50 includes the first and second epitaxial layers 56 and 58 stacked on the active region on both sides of the gate opening 62.

Figure 6A:
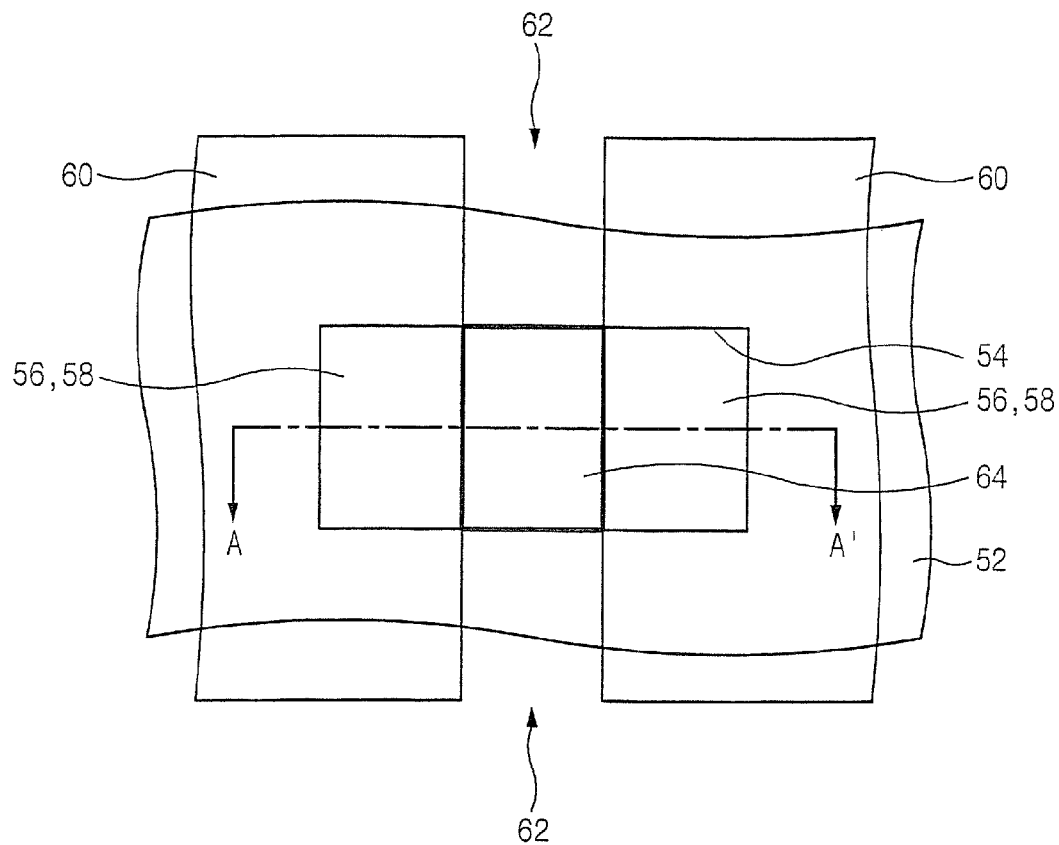
Figure 6B:
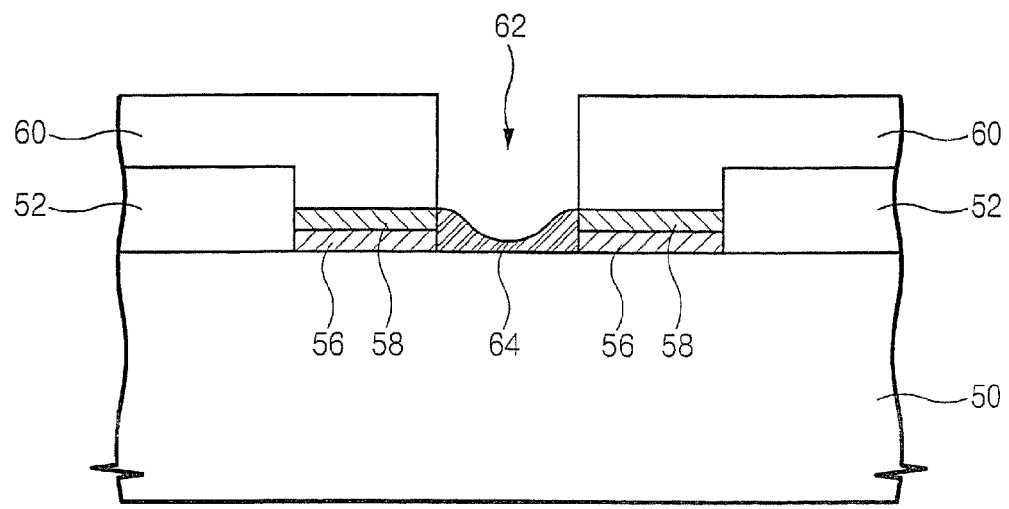

Referring now to FIGS. 6A and 6B, a third epitaxial layer 64 is formed on the exposed portion of the integrated circuit substrate 50. The third epitaxial layer 64 has an etching selectivity with respect to the first epitaxial layer 56. The third epitaxial layer 64 may be, for example, a silicon epitaxial layer. The third epitaxial layer 64 may be grown from the first and second epitaxial layers 56 and 58 and the surface of the exposed portion of the integrated circuit substrate 50. Accordingly, the third epitaxial layer 64 can be grown to have low recess region relative to a bottom surface of the second epitaxial layer 58 by controlling the growing time.

Figure 7A:
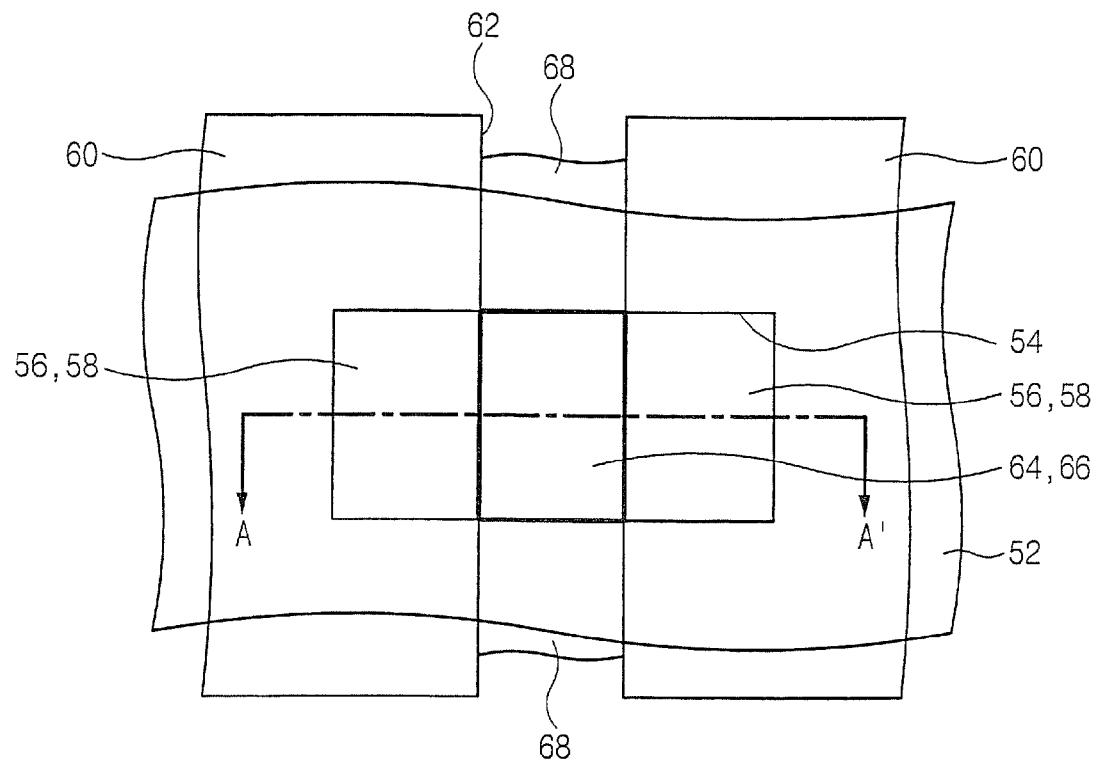
Figure 7B:
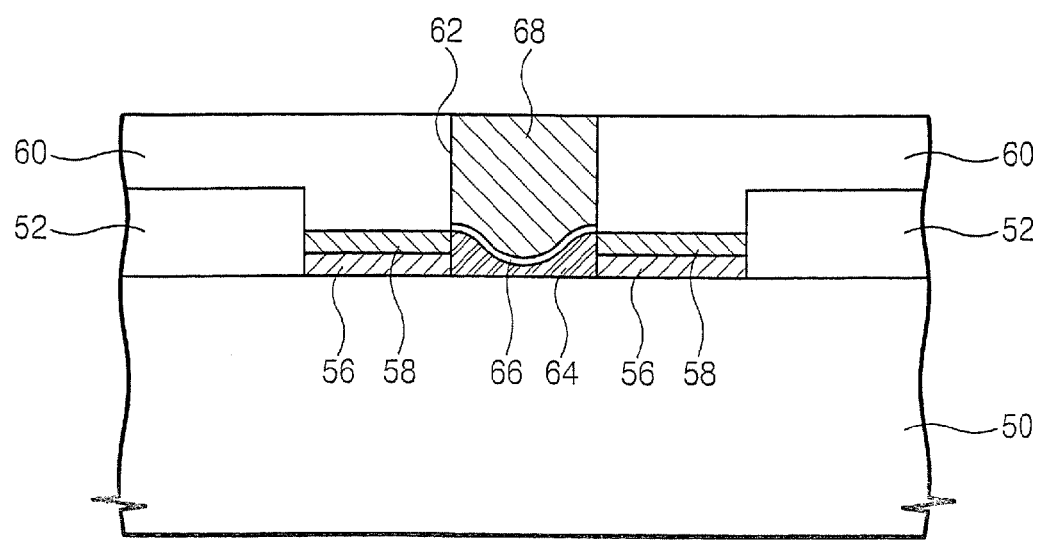
Figure 8A:
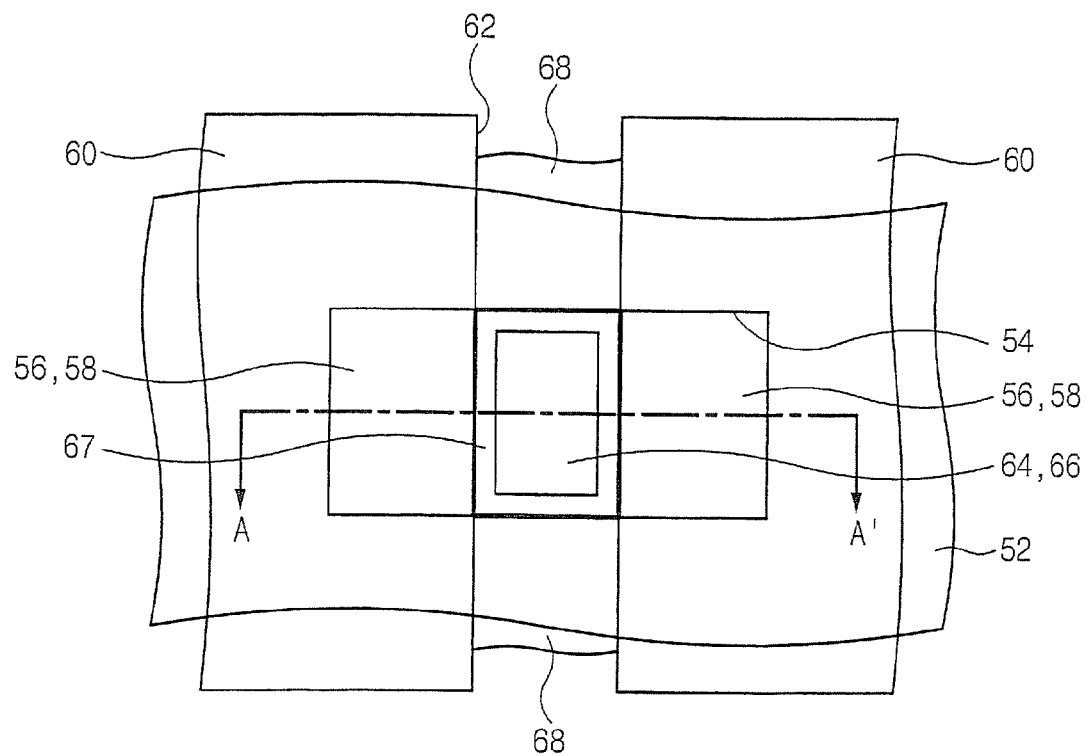
Figure 8B:
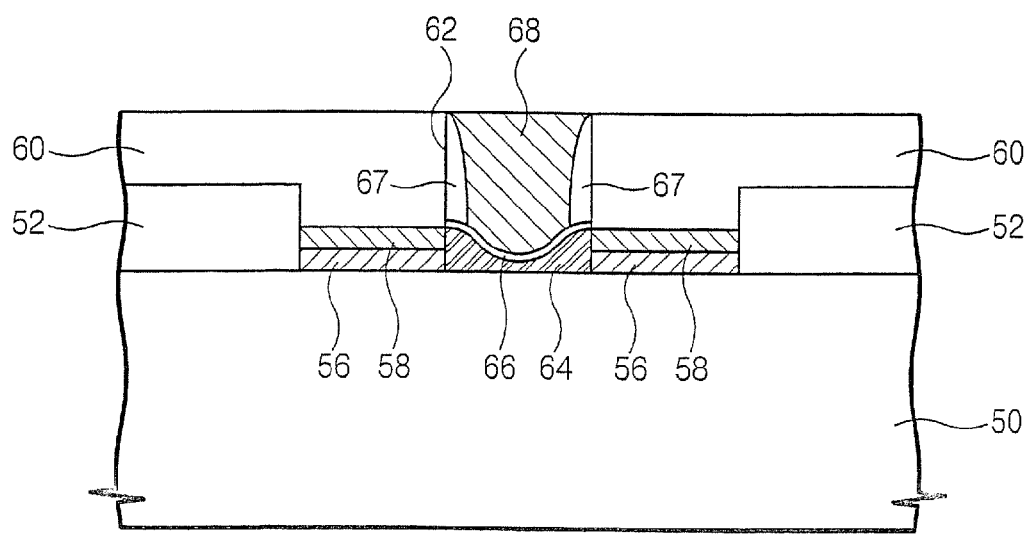

Referring now to FIGS. 7A and 7B, a gate insulation layer 66 is formed after partially channel doping to the third epitaxial layer 64. A conductive layer is formed on the integrated circuit substrate 50 including the gate insulation layer 66. A gate pattern 68 is formed in the gate opening 62 by polishing the conductive layer. The conductive layer may be polished by applying, for example, a chemical mechanical polishing process. The conductive layer may include a polysilicon layer, metal layer, metal silicide layer and/or polycide layer. The gate pattern 68 is provided on the gate insulation layer as well as the sacrificial pattern 52. As illustrated in FIGS. 8A and 8B, the conductive layer may be formed in the gate opening 62 after forming inner spacers 67 on sidewalls of the gate opening 62. In certain embodiments of the present invention, the conductive pattern 68 having inner spacers 67 defines the gate pattern. In this structure, a gate induced breakdown leakage (GIBL) current resulting from overlapping with the gate pattern by diffusing impurities of the source and drain regions can be reduced. Furthermore, the transistor can be formed with relatively short channel length.

Figure 9A:
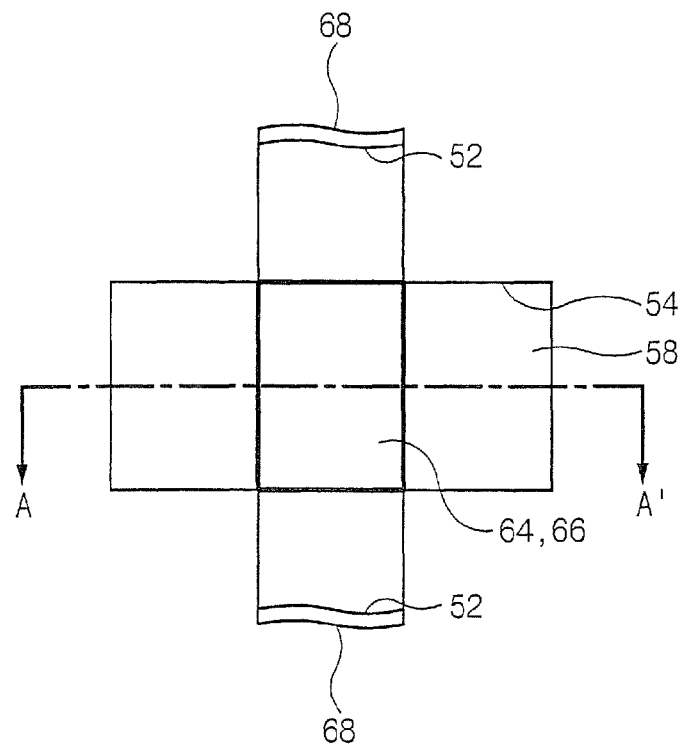
Figure 9B:
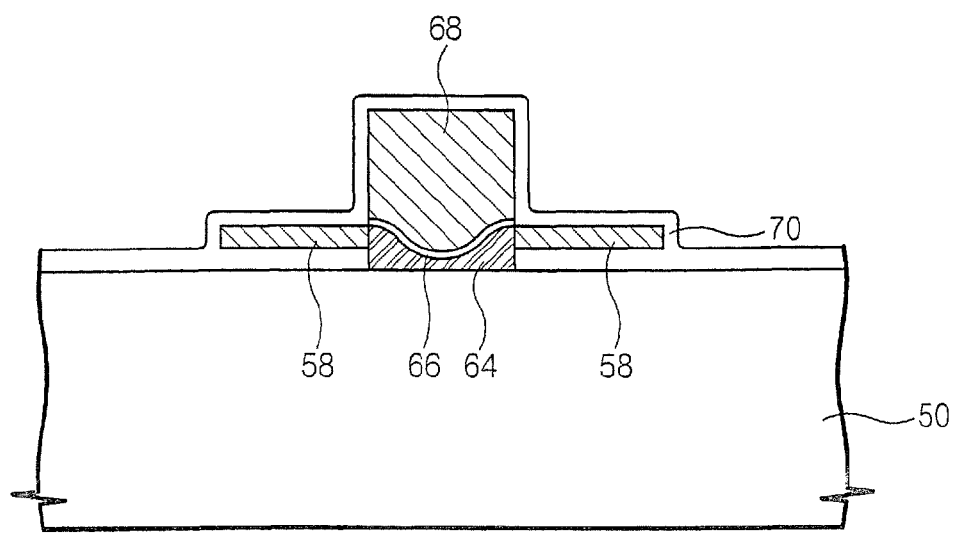

Referring now to FIGS. 9A and 9B, the mask layer 60 and the sacrificial layer 52 are removed. As a result, a portion of the first epitaxial layer 56 is exposed, and the surface of the gate pattern 68 and the surface of the second epitaxial layer 58 is exposed. The first epitaxial layer 56 is removed using, for example, an isotropic etching method. A bottom surface of the second epitaxial layer 58 is exposed by removing the first epitaxial layer 56 because the first epitaxial layer 56 has an etching selectivity with respect to the second epitaxial layer 58. The second epitaxial layer 58 extends on the integrated circuit substrate 50 to form parallel fin shapes on the third epitaxial layer 64.

As further illustrated in FIGS. 9A and 9B, an oxide layer 70 is formed in the gap region between the second epitaxial layer 58 and the integrated circuit substrate 50. The oxide layer 70 may be formed in the gap region using, for example, a thermal oxidation process on the integrated circuit substrate.

Figure 10A:
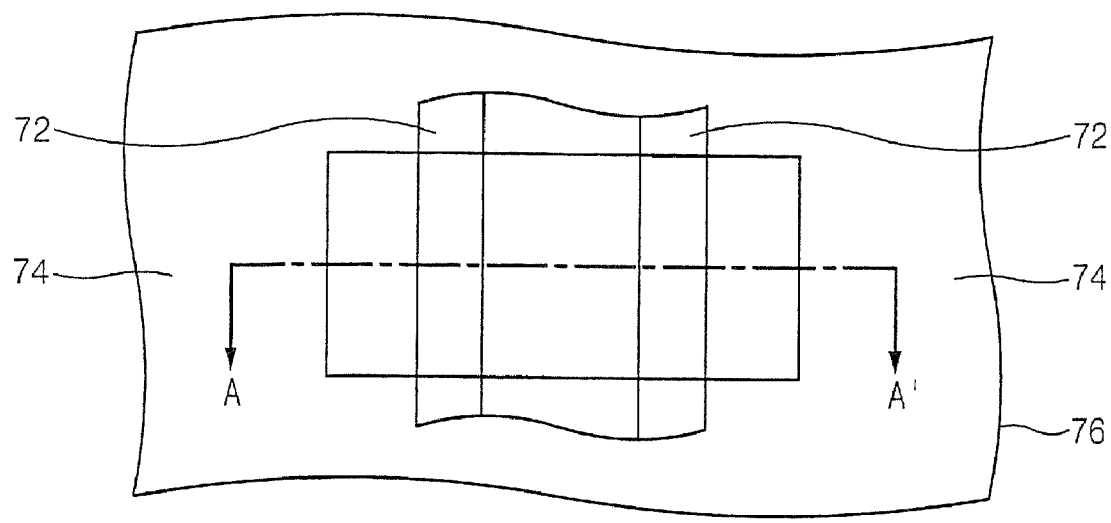
Figure 10B:
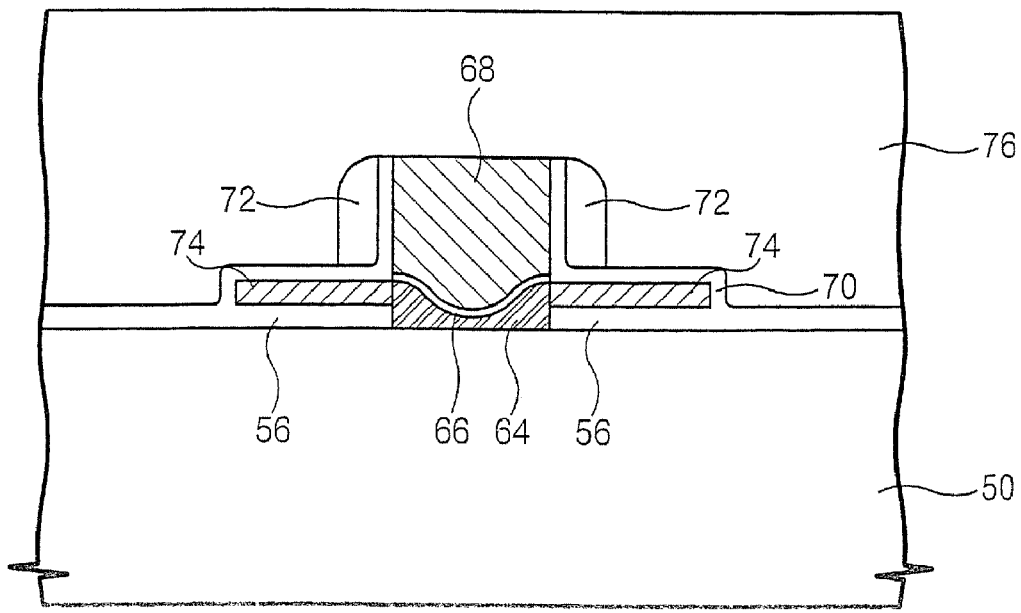

Referring now to FIGS 10A and 10B, the source and drain regions 74 are formed in the second epitaxial layer 58. The source and drain regions 74 are formed by using the gate pattern 68 as an ion implantation mask and implanting impurities into the integrated circuit substrate 50. The source and drain regions 74 are formed with, for example, a lightly doped drain (LDD) structure or double-diffused drain (DDD) structure by forming the spacer 72 on a portion of the gate pattern 68. In addition, a silicide layer may be optionally formed on the surface of the source and drain regions 74.

In certain embodiments of the present invention, during the ion implantation process, an impurity diffusion layer can be formed on the integrated circuit substrate 50 adjacent to the second epitaxial layer 68. The impurity diffusion layer may cover the active region and may reduce the likelihood of punch through between neighboring transistors.

Referring again to FIGS. 10A and 10B, the insulation layer 76 is formed on a surface of the integrated circuit substrate 50. The insulation layer 76 may not only be used as the isolation layer on the peripheral active region of the integrated circuit substrate, but may also be used as an interlayer dielectric layer by covering the integrated circuit substrate 50 including the source and drain regions 74 and the gate pattern 68.

Figure 11A:
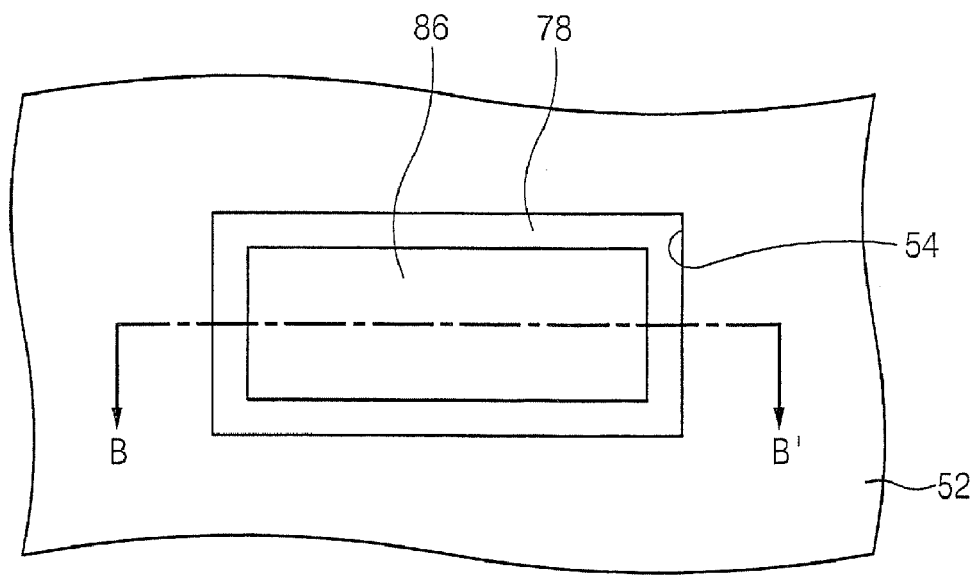
FIGS. 11A through 12A are plan views illustrating processing steps in the fabrication of MOSFETs according to still further embodiments of the present invention taken along the line B-B' of FIGS. 11A through 12A.
Figure 11B:
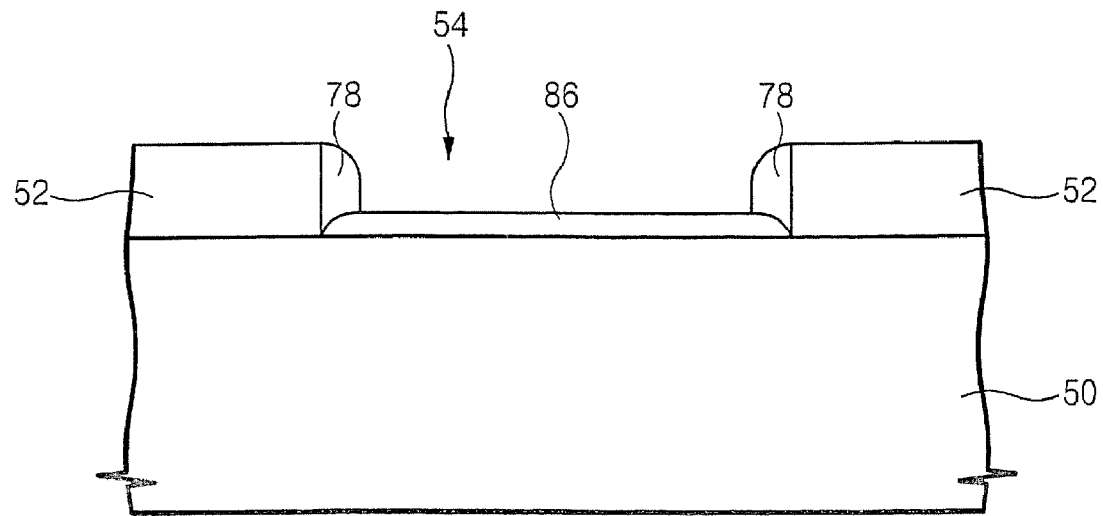
Figure 12A:
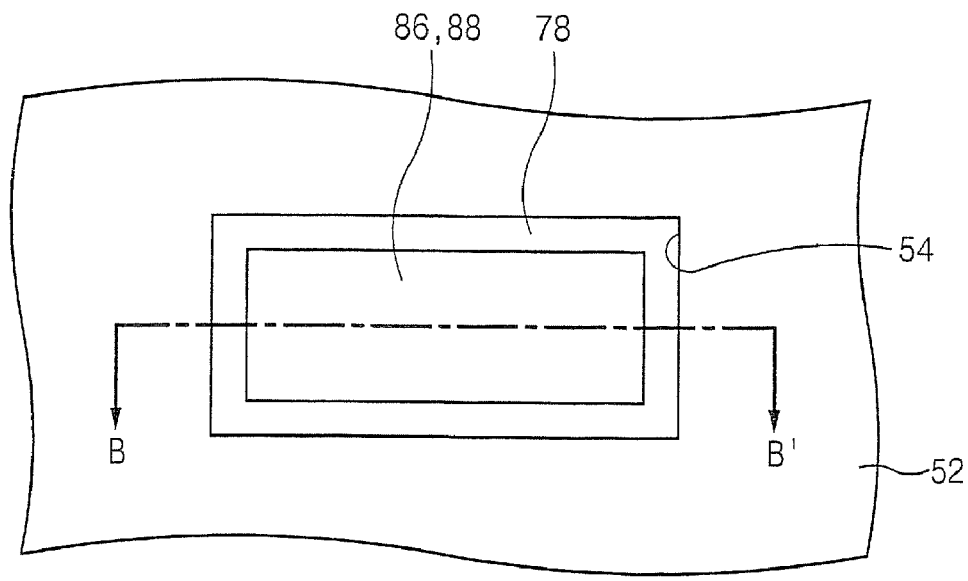
Figure 12B:
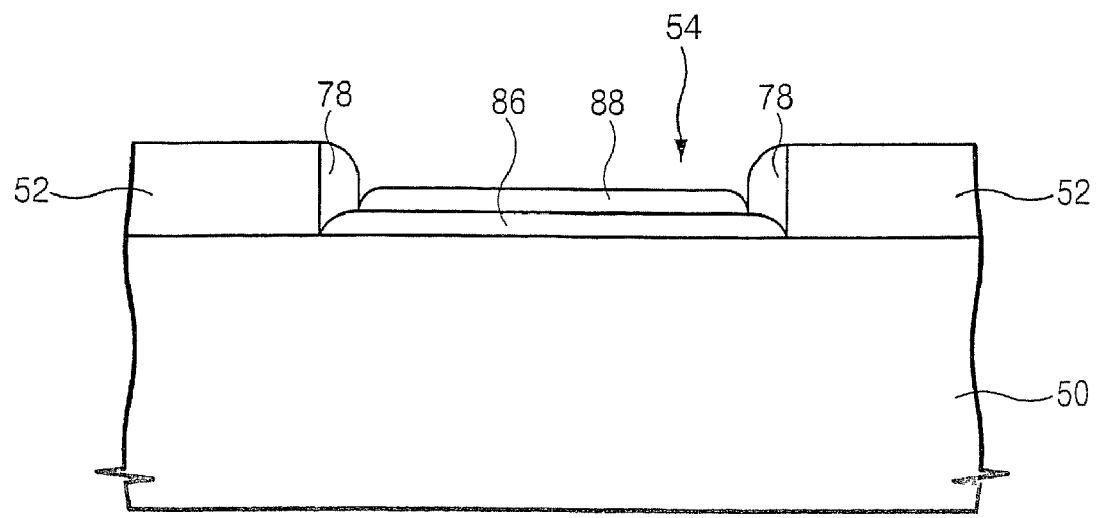

FIGS. 11A and 12A are plan views illustrating processing steps in the fabrication of transistors according to further embodiments of the present invention. FIGS. 11B and 12B are cross sections taken along the line B-B' in FIGS. 11A and 12A. Referring now to FIGS. 11A and 11B, the first epitaxial layer 68 is formed on the exposed portion of the integrated circuit substrate 50 after forming the sacrificial pattern 52 defining the active region on the integrated circuit substrate 50 as discussed above with respect to FIGS. 3 through 10B. In further embodiments of the present invention, if the first epitaxial layer is formed to a predetermined thickness, a slope facet can be formed in an edge of the first epitaxial layer. If the second epitaxial layer (58 in FIG. 4B) is formed on the first epitaxial layer 86, the first epitaxial layer 86 covered by the second epitaxial layer can remain in a subsequent process removing the first epitaxial layer 86. In other words, the second epitaxial layer protects a portion of the first epitaxial layer 86. In order to reduce the likelihood that the facet will be removed, sidewall spacers 78 are formed on sidewalls of the opening 54. Sidewalls spacers 78 cover a part of the first epitaxial layer 86, that is, the facet of the first epitaxial layer.

Referring to FIGS. 12A and 12B, the second epitaxial layer 88 is formed on the first epitaxial layer 86 by, for example, applying a selective epitaxial growing process to the integrated circuit substrate 50 including the sidewalls spacers 78.

Subsequent processes can be performed as discussed above with respect to FIGS. 3 through 10B. Sidewalls spacers 78 may be formed of materials having an etching selectivity with respect to the sacrificial pattern 52 or the mask layer (60 in FIG. 5B). Therefore, the sidewalls spacers 78 can be removed during the same process used to remove the sacrificial pattern 52 or the mask layer (60 in FIG. 5B).

Figure 13A:
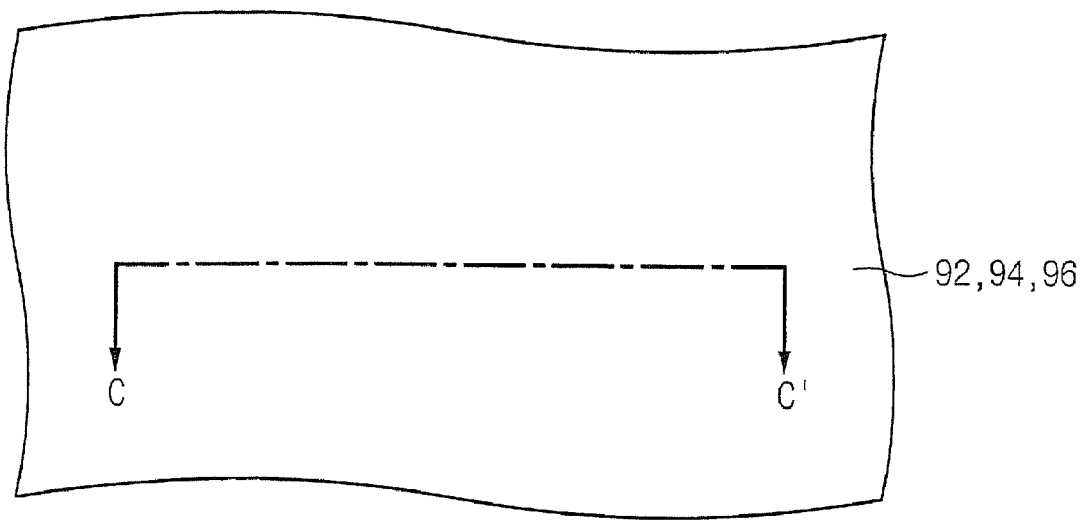
Figure 13B:
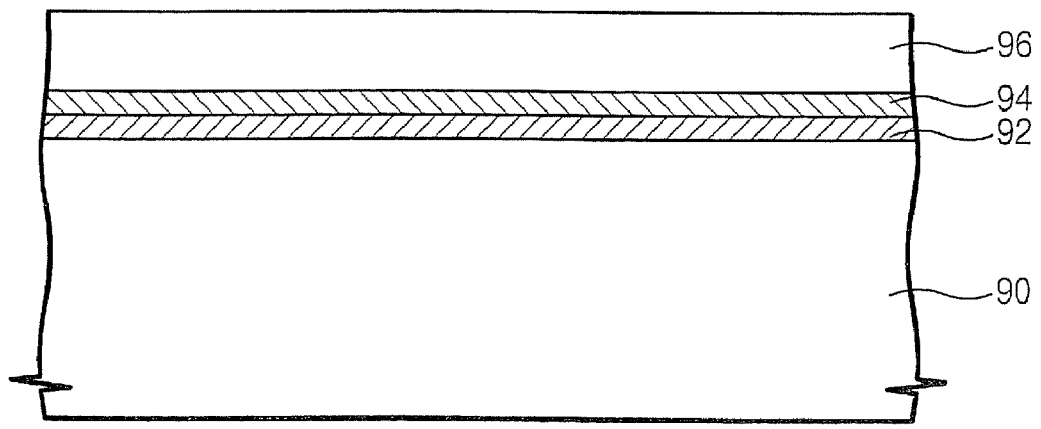

FIGS. 13A through 16A are plan views illustrating processing steps in the fabrication of transistors according to further embodiments of the present invention. FIGS. 13B through 16B are cross sections taken along the line C-C' in FIGS. 12A through 15B, respectively. As illustrated in FIGS. 13A and 13B, the first epitaxial layer 92, the second epitaxial layer 94 and the mask layer 96 are sequentially formed. The first and second epitaxial layers 92 and 94 may include the same materials as a lattice constant of the integrated circuit substrate 90. In other words, the first epitaxial layer 92 may be, for example, a silicon germanium epitaxial layer and the second epitaxial layer 94 may be, for example, a silicon epitaxial layer. The mask layer 96 may include, for example, silicon nitride.

Figure 14A:
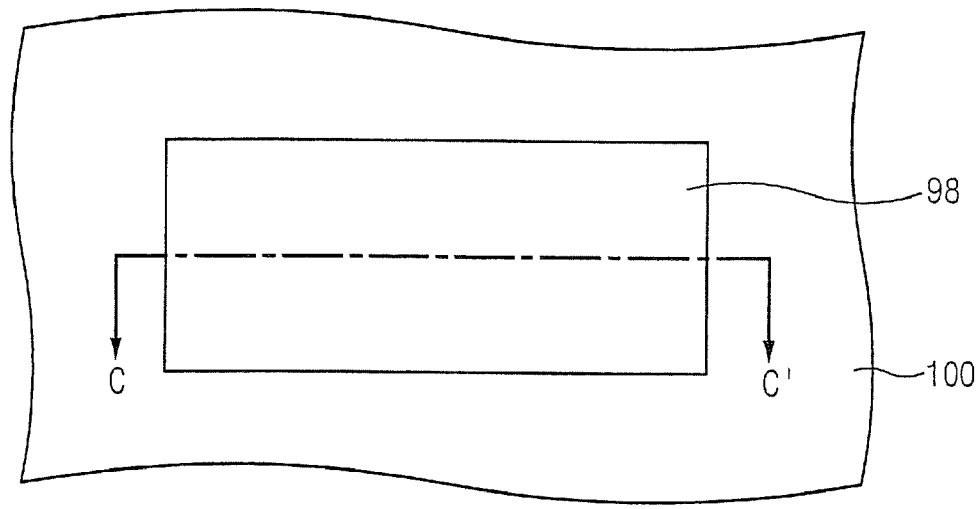
Figure 14B:
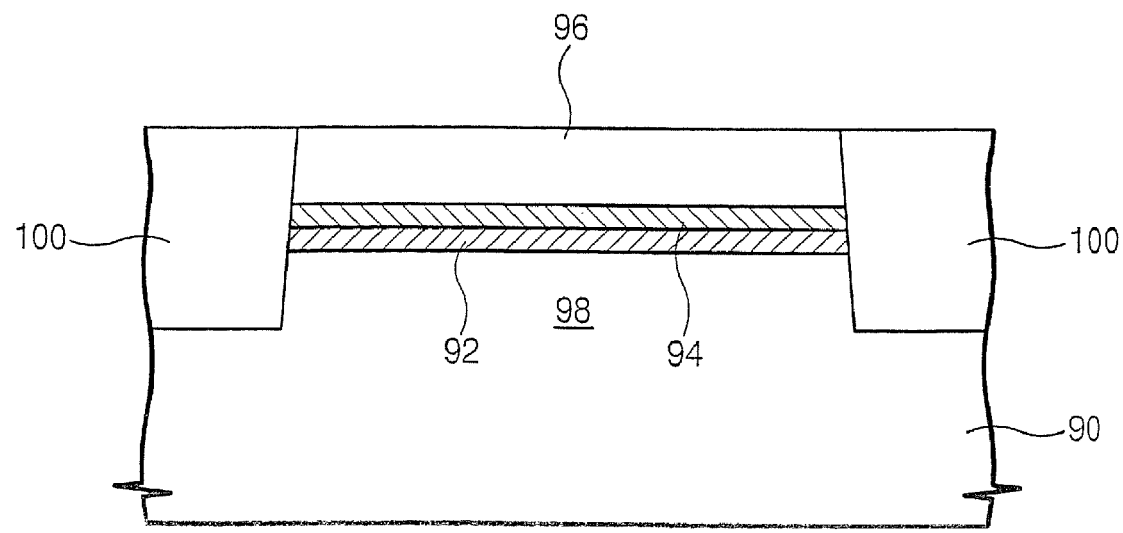

Referring now to FIGS. 14A and 14B, the first epitaxial layer 92, the second epitaxial layer 94 and the mask layer 96 are patterned to form a trench that defines the active region 98. The first epitaxial layer 92, the second epitaxial layer 94 and the mask layer 96 are stacked on the active region 98. In certain embodiments of the present invention, a part of the integrated circuit substrate may be etched after patterning the first epitaxial layer 92. The isolation layer 100 may be formed by providing the insulation layer in the trench. The isolation layer 100 may be provided on the first and second epitaxial layers 92 and 94 and the mask layer 96.

Figure 15A:
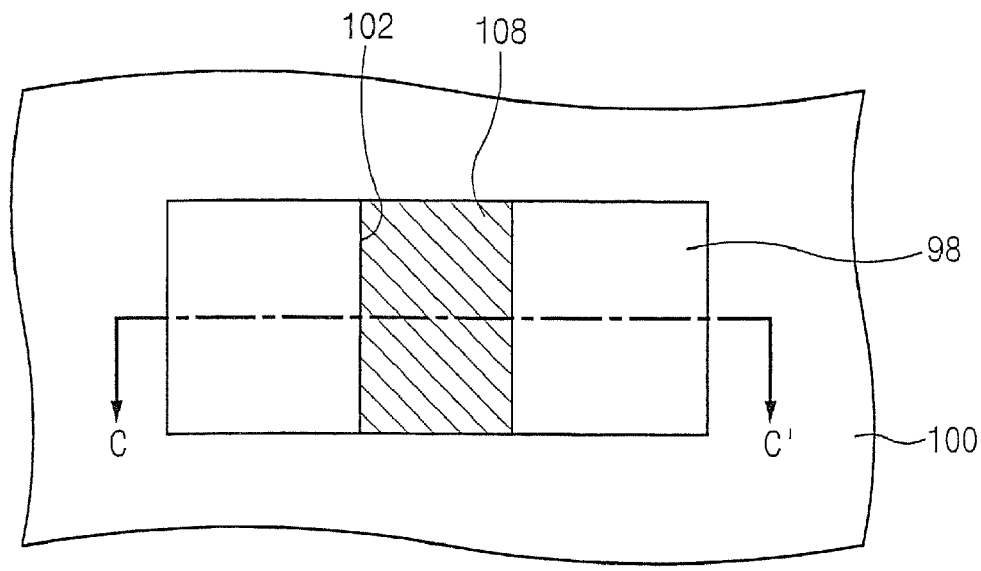
Figure 15B:
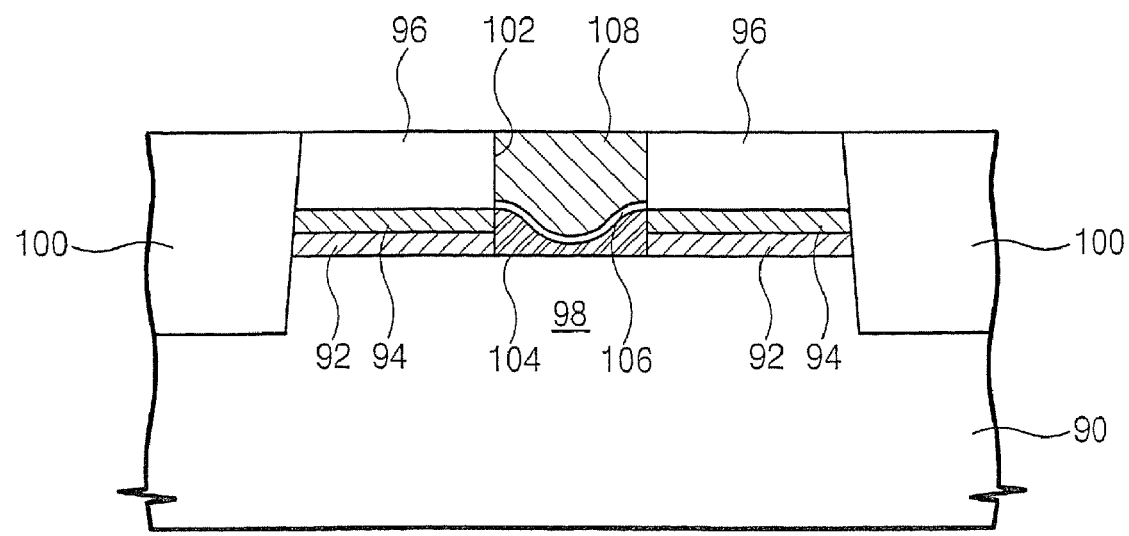

Referring now to FIGS. 15A and 15B, the gate opening 102 is formed by, for example, patterning a part of the mask layer 96 and the first and second epitaxial layers 92 and 94. A portion of the integrated circuit substrate 90 is exposed by the gate opening 102. Although not illustrated in the Figures, the gate opening 102 can be formed to cross over a surface of the isolation layer 100 by partially patterning the surface of the isolation layer 100. The third epitaxial layer 104 is formed on the exposed portion of the integrated circuit substrate 90. As discussed above with respect to FIGS. 3 through 10B, the third epitaxial layer 104 is formed having a low recess region in relation to a bottom surface of the second epitaxial layer by, for example, controlling the growing time.

The gate insulation layer 106 is formed on the third epitaxial layer 104. A gate pattern 108 is formed in the gate opening. Although not illustrated in the Figures, a gate line, which directly contacts the gate pattern 108 and crosses over a top surface of the isolation layer 100, may also be formed. However, if the gate opening is formed to cross over a top surface of the isolation layer, the gate pattern 108 also crosses over the top surface of the isolation layer. The gate pattern 108 may include a polysilicon layer, metal layer and/or polycide layer.

Figure 16A:
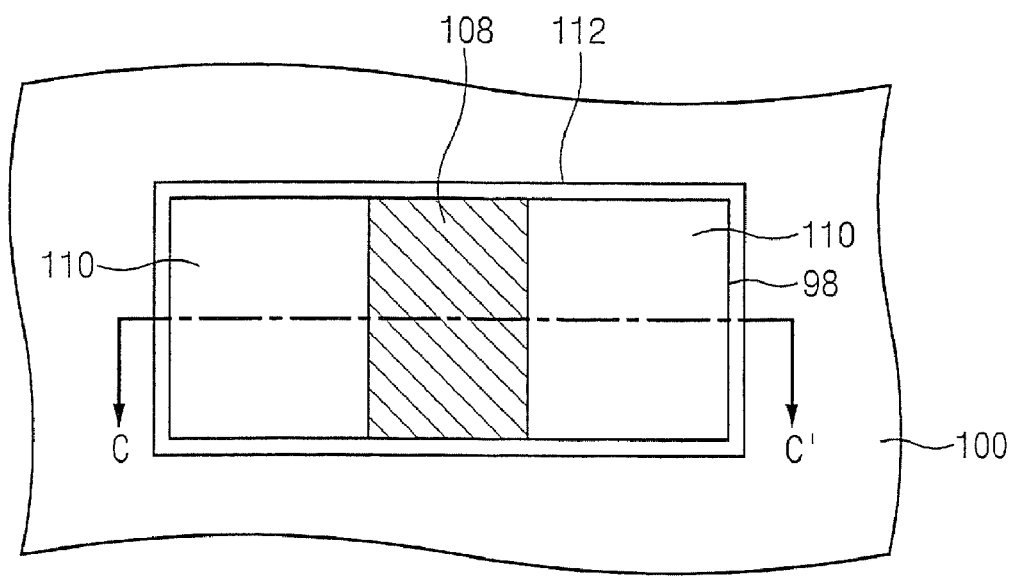
Figure 16B:
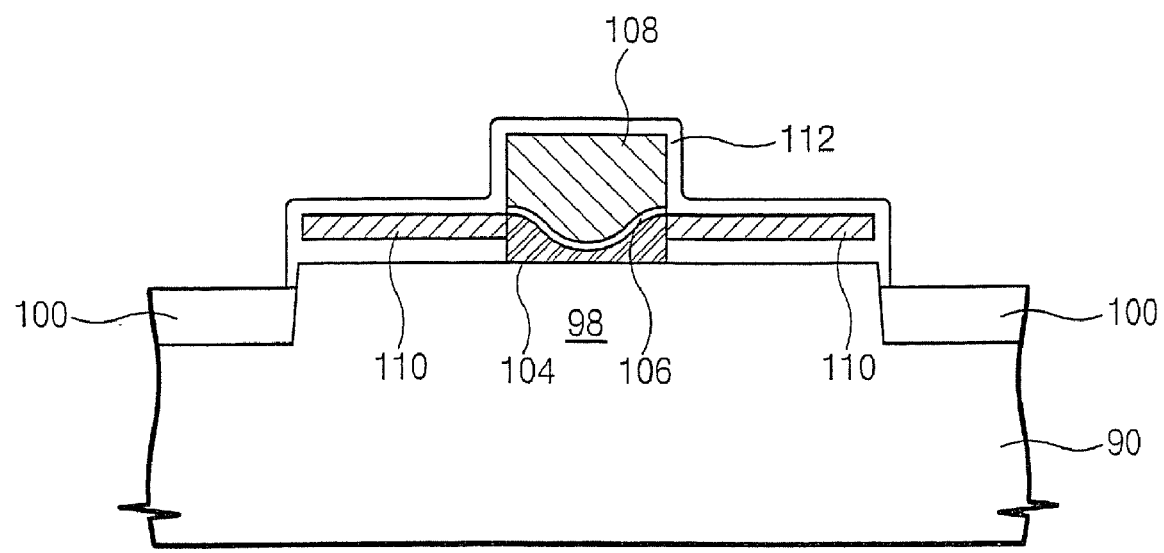

Referring now to FIGS. 16A and 16B, the mask layer 96 is removed. A portion of the first epitaxial layer 92 is exposed by recessing a part of the isolation layer 100. The first epitaxial layer 92 is removed. The first epitaxial layer 92 may be removed by, for example, an isotropic etching because a portion of the first epitaxial layer 92 is exposed. As a result, a bottom of the second epitaxial layer 94 and a portion of sidewalls of the third epitaxial layer 104 are exposed. An insulation layer 112 is formed in the gap regions between the second epitaxial layer 94 and the integrated circuit substrate 90. The source and drain regions are formed on the second epitaxial layer 94, and the interlayer dielectric layer is formed on a surface of the integrated circuit substrate 90.

Figure 17A:
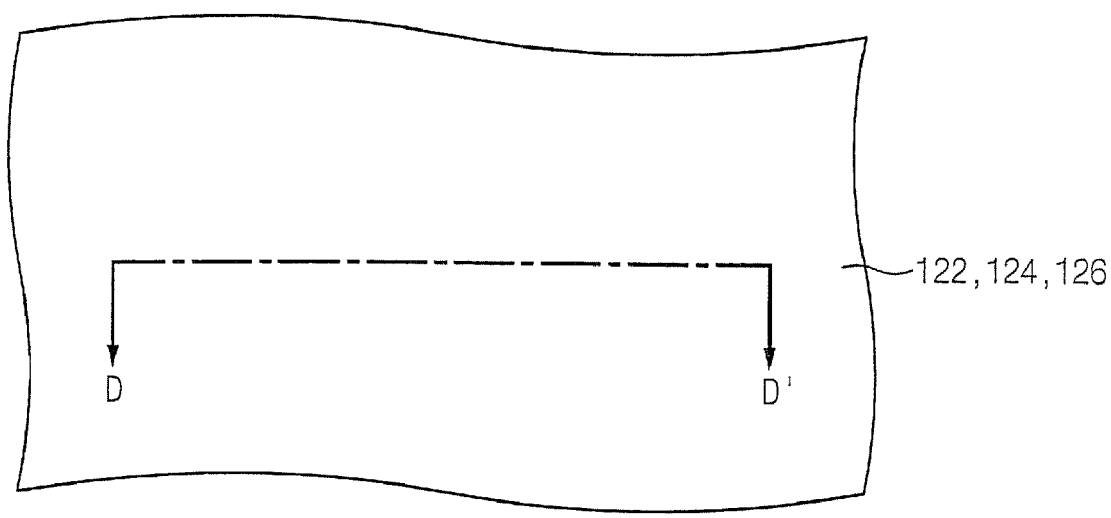
Figure 17B:
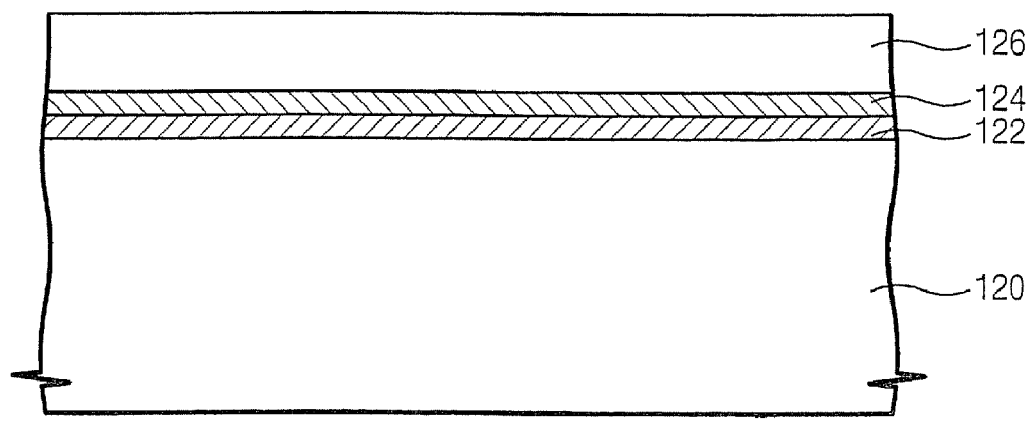

FIGS. 17A through 21A are plan views illustrating processing steps in the fabrication of transistors according to some embodiments of the present invention. FIGS. 17D through 21B are cross sections taken along the line D-D' in FIG. 16A through FIG. 20A, respectively. As illustrated in FIGS. 17A and 17B, the first epitaxial layer 122, the second epitaxial layer 124 and the mask layer 126 are formed on the integrated circuit substrate 120. The first and second epitaxial layers 122 and 124 may include similar materials as discussed above with respect to FIGS. 3 through 10B.

Figure 18A:
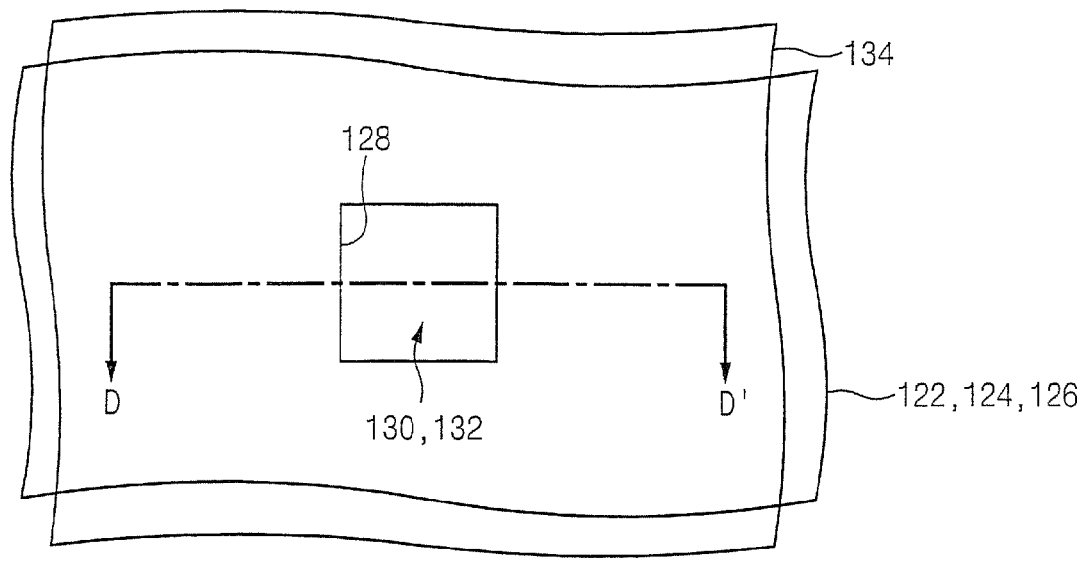
Figure 18B:
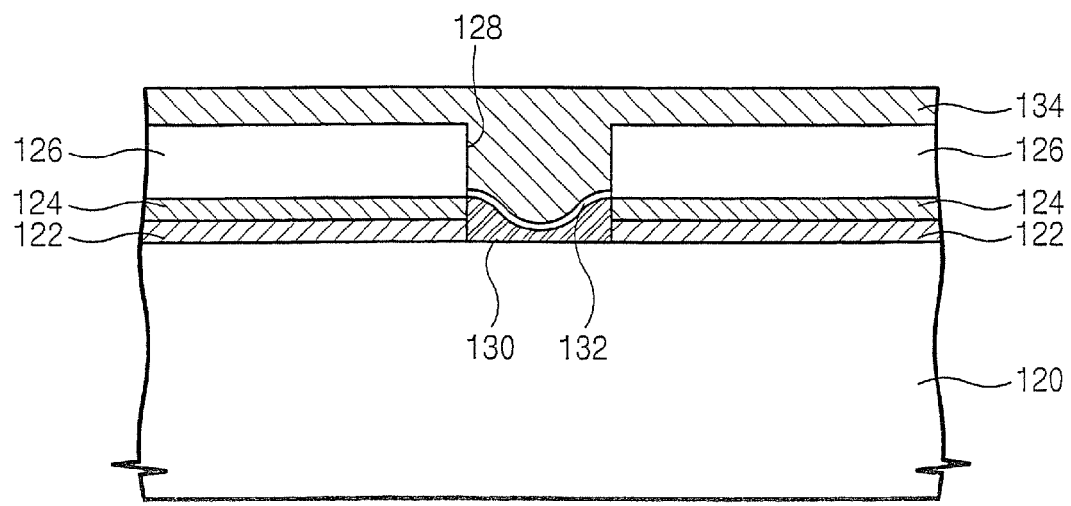

Referring now to FIGS. 18A and 18B, the first epitaxial layer 122, the second epitaxial layer 124 and the mask layer 126 are patterned to form the gate opening 128 that exposes a portion of the integrated circuit substrate 120. The third epitaxial layer 130 is formed on the integrated circuit substrate 120 in the gate opening 128. The third epitaxial layer 130 may be formed to have a low recess region in relation to a bottom surface of the second epitaxial layer by, for example, controlling a growing time. The gate insulation layer 132 is formed on the third epitaxial layer 130. The conductive layer 134 is provided in the gate opening on the integrated circuit substrate 120.

Figure 19A:
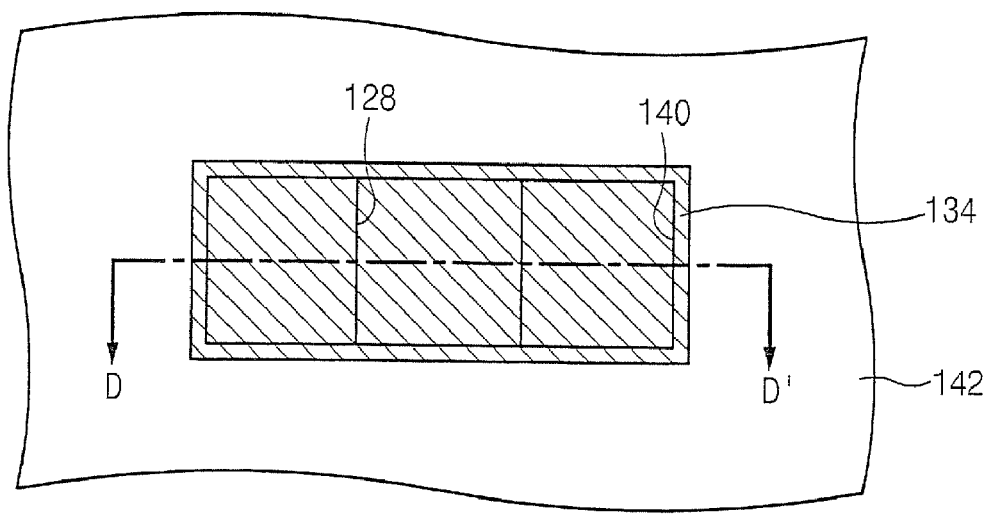
Figure 19B:
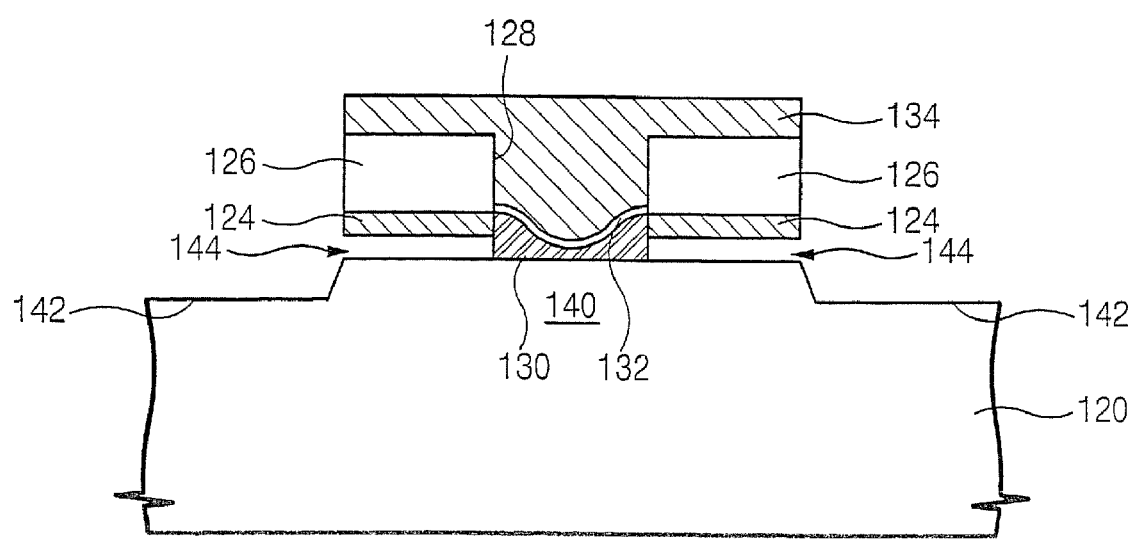

Referring now to FIGS. 19A and 19B, the trench 142, the conductive layer 124, the first and second epitaxial layers 122 and 124, the mask layer 126 and a portion of the integrated circuit substrate 120 are patterned to form a trench that defines the active region. The active region 140 has sidewalls aligned to sidewalls of the third epitaxial layer in one direction and includes a portion of the integrated circuit substrate 120 on both sides of the epitaxial layer 130 in another direction. A bottom of the second epitaxial layer 124 and a portion of a sidewall of the third epitaxial layer 130 are exposed by removing the first epitaxial layer 122.

Figure 20A:
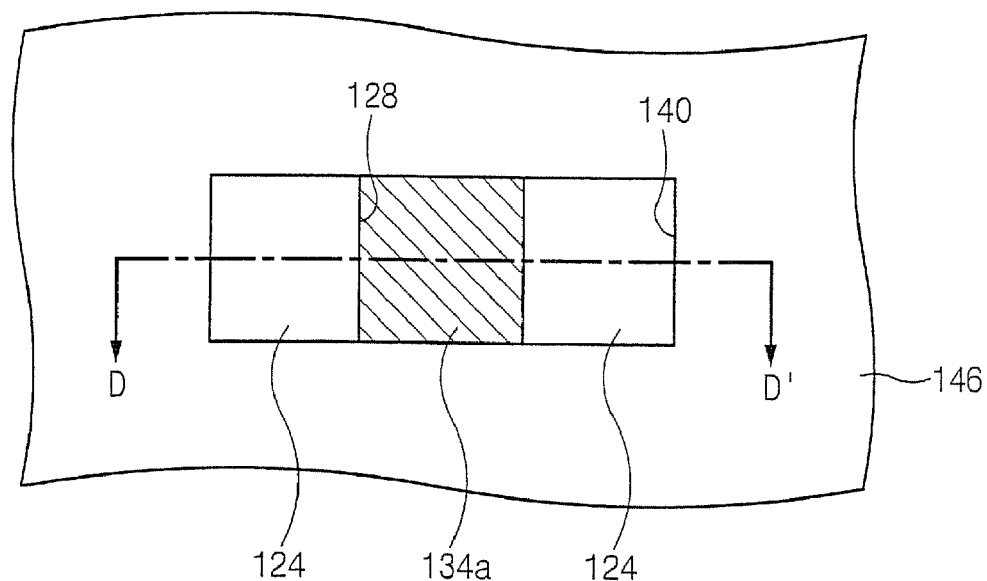
Figure 20B:
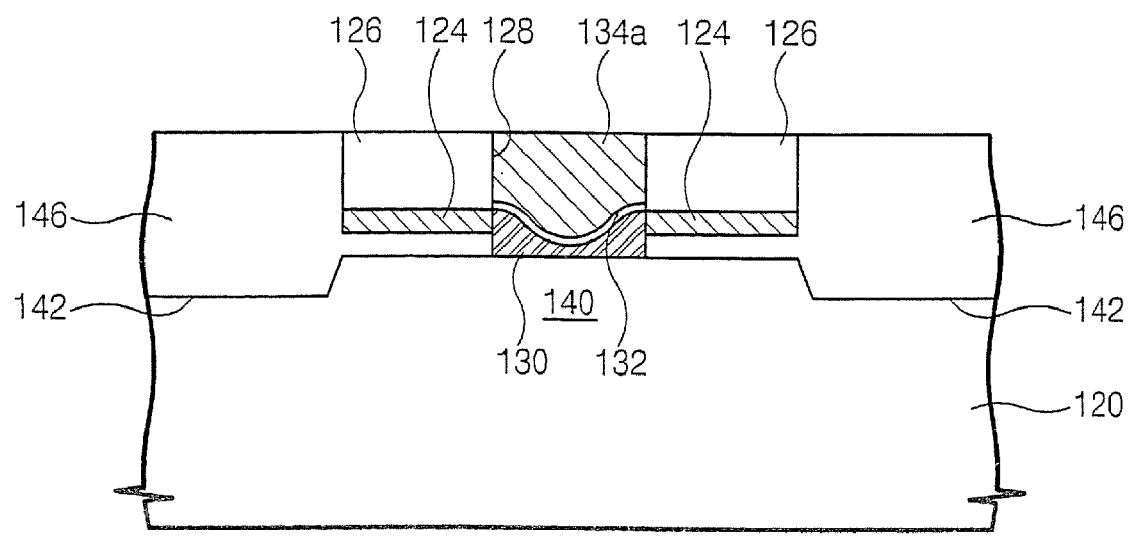

Referring now to FIGS. 20A and 20B, the insulation layer is on a surface of the integrated circuit substrate 120 in the gap region 144 between the second epitaxial layer 124 and the integrated circuit substrate 120. The insulation layer may be formed using, for example, a thermal oxidation process and then a chemical vapor deposition process. The mask layer 126 is exposed by, for example, etching the insulation layer and the conductive layer 134. As illustrated in FIGS. 20B, a gate pattern is formed in the gate opening, and the isolation layer 146 is provided on peripherals of the active region 140.

Figure 21A:
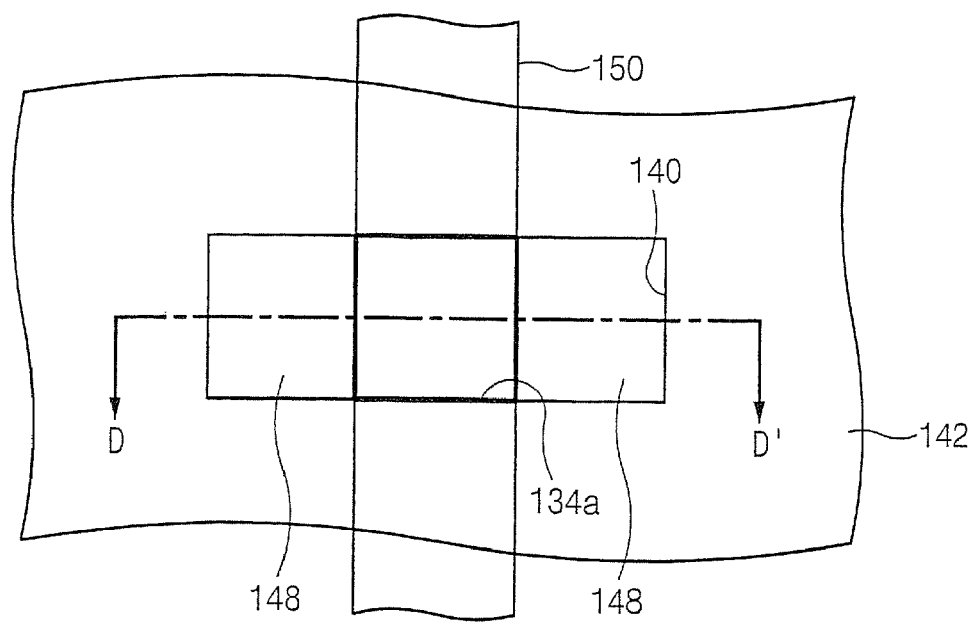
Figure 21B:
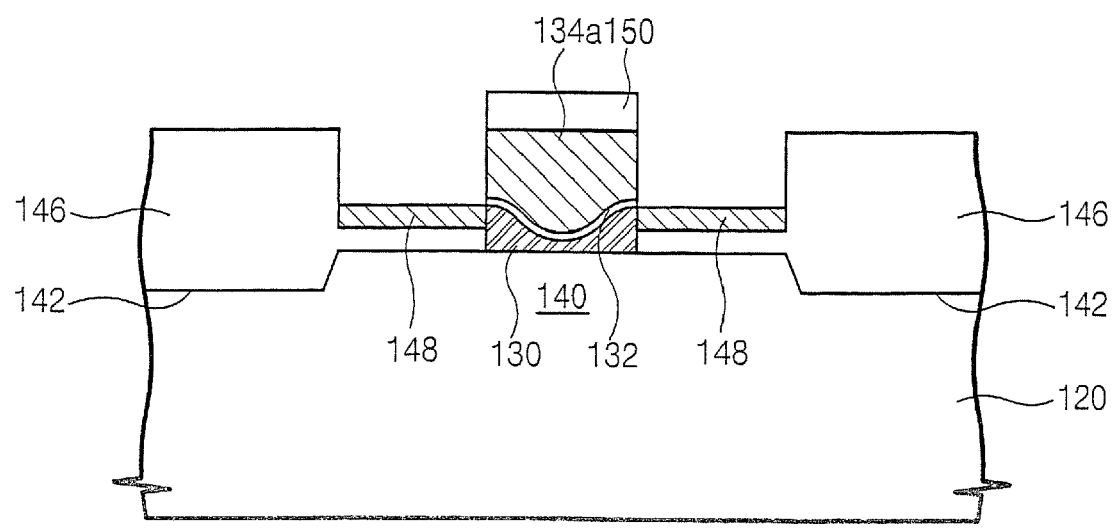

Referring now to FIGS. 21A and 21B, the gate line 150 is formed. The gate line 150 may directly contact the gate pattern 134a and cross over a top surface of the isolation layer 146. The gate line 150 may include a polysilicon layer, a metal layer, a metal silicide layer and/or a polysilicide layer. The second epitaxial layer 124 is exposed by removing the mask layer 126. The source and drain regions 148 are formed by implanting impurities in the exposed portion of the second epitaxial layer 124. The source and drain regions 148 can be formed having a DDD structure or an LDD structure. The spacer can be formed on a sidewall of the gate pattern 134a. In addition, a silicide layer may be provided on the gate line 150 and the source and drain regions 148.

As briefly discussed above with respect to FIGS. 3 through 21B, transistors according to embodiments of the present invention may have a low recessed channel region in relation to a bottom surface of the source and drain regions. Thus, a channel length of transistors according to embodiments of the present invention may be longer relative to a gate line width, while still having a relatively short gate line width. Thus, the likelihood that transistors according to embodiments of the present invention may experience a short channel effect and/or punch-through between the source and drain regions may be reduced. Furthermore, transistors according to embodiments of the present invention may provide source and drain regions having bottom surfaces that contact at least a portion of the insulation pattern and a channel region between the source and drain regions may be connected to the integrated circuit substrate. Accordingly, transistors according to embodiments of the present invention may provide a reduced likelihood of the occurrence of the short channel effect and a floating body effect and may disperse heat throughout the device during operation of the transistor. Furthermore, transistors according to embodiments of the present invention may have a gate pattern having sidewalls aligned with parallel fins that include the source and drain regions. This structure may reduce the possibility of misalignment of the gate pattern and may reduce characteristic dispersion of transistor in a cell array region.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a semiconductor device, comprising:

forming a source/drain epitaxial layer and first insulating layer on a semiconductor substrate, the first insulating layer and the epitaxial layer having an opening defined therein, the opening exposing a portion of the semiconductor substrate;

forming a channel epitaxial layer in the opening and on the exposed portion of the semiconductor substrate, the channel epitaxial layer having a recess region that is lower than a bottom surface of the source/drain epitaxial layer;

forming a gate electrode in the opening and on the channel epitaxial layer; and forming a second insulating layer between the source/drain epitaxial layer and the semiconductor substrate, wherein an inner sidewall of the first insulating layer and a sidewall of the gate electrode are coplanar in the opening.

2. The method of claim 1, further comprising implanting impurities into the channel epitaxial layer to form a channel region.

3. The method of claim 1, further comprising forming a source/drain region in the source/drain epitaxial layer.

4. The method of claim 1, wherein forming a gate electrode comprises forming a conductive layer in the opening and on the first insulating layer, and wherein the method further comprises forming a trench to define an active region by patterning the conductive layer, the first insulating layer and the source/drain epitaxial layers.

5. The method of claim 1, wherein the gate electrode has a top surface of the same height as a top surface of the first insulating layer.

6. The method of claim 1, wherein a lower surface of the gate electrode is curved.

7. A method of forming a semiconductor device, comprising:

forming a first epitaxial layer on a semiconductor substrate;

forming a second epitaxial layer on the first epitaxial layer; and forming a mask layer on the second epitaxial layer;

forming a gate opening in the first epitaxial layer, the second epitaxial layer and the mask layer by patterning the first and second epitaxial layers and the mask layer;

forming a third epitaxial layer having a low recess region relative to a bottom surface of the second epitaxial layer on the semiconductor substrate;

forming a gate insulation layer on the third epitaxial layer;

forming a gate pattern in the gate opening;

removing the first epitaxial layer to expose the bottom surface of the second epitaxial layer and a portion of the third epitaxial layer; and forming an insulation layer in a gap region between the second epitaxial layer and the semiconductor substrate.

8. The method of claim 7, further comprising implanting impurities in the third epitaxial layer using the mask layer as an ion implantation mask.

9. The method of claim 7, further comprising:

removing the mask layer; and forming source and drain regions on the second epitaxial layer by implanting impurities using the gate pattern as the ion implantation mask.

10. The method of claim 7, further comprising forming first and second inner spacers on sidewalls of the gate opening before forming the gate pattern.

11. The method of claim 7, further comprising:

forming a sacrificial pattern having an opening defining an active region on the semiconductor substrate, before forming the first epitaxial layer and the second epitaxial layer; and removing the mask layer and the sacrificial pattern, before removing the first epitaxial layer.

12. The method of claim 7, further comprising:

forming a trench by patterning the first epitaxial layer, the second epitaxial layer, the mask layer and the semiconductor substrate to define an active region, and forming an isolation layer in the trench, before forming a gate opening; and removing a portion of the isolation layer to expose a portion of the first epitaxial layer, before removing the first epitaxial layer.

13. The method of claim 7, wherein forming a gate pattern in the gate opening comprises:

forming a conductive layer in the gate opening on the mask layer; and polishing the conductive layer to expose the mask layer and to form the gate pattern filling the gate opening.

14. The method of claim 11, further comprising:

forming sidewall spacers on inner sidewalls of the sacrificial pattern before forming the second epitaxial layer.

15. A method of fabricating a semiconductor device, comprising:

forming a first epitaxial layer on a semiconductor substrate;

forming a second epitaxial layer on the first epitaxial layer;

forming a mask layer on the second epitaxial layer;

patterning the first epitaxial layer, the second epitaxial layer and the mask layer to form a gate opening exposing at least a portion of the semiconductor substrate;

forming a third epitaxial layer on the exposed portion of the semiconductor substrate;

forming a gate insulation layer on the third epitaxial layer;

forming a conductive layer in the gate opening on the mask layer;

patterning the first and second epitaxial layers, the mask layer and the conductive layer to define an active region;

removing the first epitaxial layer to expose a portion of the third epitaxial layer and a bottom of the second epitaxial layer to define an active region;

forming an insulation layer on the semiconductor substrate and in a gap region between the second epitaxial layer and the active region;

exposing the mask layer by sequentially polishing the insulation layer and the conductive layer and simultaneously forming a gate pattern in the gate opening and forming an isolation layer surrounding bottom of the gate pattern and the mask layer; and removing the mask layer to expose the second epitaxial layer on both sides of the gate pattern.

16. The method of claim 15, further comprising:

forming a channel region on the exposed portion of the semiconductor substrate by implanting impurities using the mask layer as an ion implantation mask; and forming source and drain regions in the exposed portion of the second epitaxial layer by implanting impurities in the exposed portion of the second epitaxial layer using the gate pattern as the ion implantation.

17. The method of claim 15, wherein patterning the first epitaxial layer is followed by forming a trench further defining the active region by continuously patterning a part of the semiconductor substrate.

18. The method of claim 15, further comprising forming a gate line contacting the gate pattern and on the isolation layer.

* * * * *